United States Patent
Kim (10) Patent No.: US 11,549,992 B2
(45) Date of Patent: Jan. 10, 2023

(54) BMS SEMICONDUCTOR DEVICE HAVING LEAKAGE CURRENT DETECTION FUNCTION AND LEAKAGE CURRENT DETECTION METHOD THEREOF

(71) Applicant: HYUNDAI MOBIS CO., LTD., Seoul (KR)

(72) Inventor: Seulkirom Kim, Seoul (KR)

(73) Assignee: HYUNDAI MOBIS CO., LTD., Seoul (KR)

( * ) Notice: Subject to any disclaimer, the term of this patent is extended or adjusted under 35 U.S.C. 154(b) by 47 days.

(21) Appl. No.: 17/084,988

(22) Filed: Oct. 30, 2020

(65) Prior Publication Data
US 2021/0132155 A1    May 6, 2021

(30) Foreign Application Priority Data
Nov. 5, 2019   (KR) .......................... 10-2019-0140176

(51) Int. Cl.
*G01R 31/52* (2020.01)
*G01R 31/3842* (2019.01)
*H02J 7/00* (2006.01)

(52) U.S. Cl.
CPC ......... *G01R 31/3842* (2019.01); *G01R 31/52* (2020.01); *H02J 7/0047* (2013.01); *H02J 7/0029* (2013.01)

(58) Field of Classification Search
USPC ......................................... 324/426, 433–435
See application file for complete search history.

(56) References Cited

U.S. PATENT DOCUMENTS

| 2002/0021111 | A1* | 2/2002 | Ogino | ....................... | H02J 7/16 |
| | | | | | 322/28 |
| 2016/0336623 | A1* | 11/2016 | Nayar | .................... | H02J 7/0048 |

FOREIGN PATENT DOCUMENTS

| KR | 10-0851839 B1 | 8/2008 |
| KR | 10-0968350 B1 | 7/2010 |
| KR | 10-1164202 B1 | 7/2012 |
| KR | 10-2014-0010417 A | 1/2014 |
| KR | 10-1619483 B1 | 5/2016 |
| KR | 2016-0069800 A | 6/2016 |

* cited by examiner

*Primary Examiner* — Vincent Q Nguyen
(74) *Attorney, Agent, or Firm* — Morgan, Lewis & Bockius LLP (57) ABSTRACT

A Battery Management System (BMS) semiconductor device having a leakage current detection function, may include: a comparator configured to compare a voltage of a balancing terminal connected to a positive voltage terminal of a battery cell and a voltage of a lower sensing terminal connected to a negative voltage terminal of the battery cell and output a result of the comparing; an ADC connected to the upper sensing terminal and the lower sensing terminal and configured to sense a voltage difference between the upper sensing terminal connected to the positive voltage terminal of the battery cell and the lower sensing terminal; and a leakage current determining unit connected to the ADC and the comparator and configured to set a variable threshold value according to the difference value sensed by the ADC and determine whether a leakage current is generated by using the result of the comparing in the comparator and the variable threshold value.

8 Claims, 4 Drawing Sheets

BMS SEMICONDUCTOR DEVICE HAVING LEAKAGE CURRENT DETECTION FUNCTION AND LEAKAGE CURRENT DETECTION METHOD THEREOF

CROSS-REFERENCE TO RELATED APPLICATIONS

The present application claims priority to Korean Patent Application No. 10-2019-0140176 filed on Nov. 5, 2019, the entire contents of which is incorporated herein for all purposes by this reference.

BACKGROUND OF THE INVENTION

Field of the Invention

The present invention relates to a Battery Management System (BMS) semiconductor device having a leakage current detection function and a leakage current detection method thereof.

Description of Related Art

Recently, various apparatuses, such as industrial devices, household devices, and vehicles using high-voltage batteries have appeared, and particularly, the use of high-voltage batteries becomes more active in the automotive technology field.

A vehicle using an internal combustion engine using fossil fuel, such as gasoline or heavy oil, as main fuel has a serious impact on the occurrence of pollution, such as air pollution. Accordingly, recently, to decrease the occurrence of pollution, a lot of effort is being exerted for the development of an Electric Vehicle (EV) or a hybrid vehicle.

The EV refers to a vehicle using an electric battery and an electric motor without using fossil fuel and an engine. That is, the EV driving the vehicle by rotating a motor with electricity accumulated in a battery was developed earlier than gasoline vehicles. However, the EV was not commercialized due to problems, such as a heavy battery, the limit of a battery capacity, and a charging time, but as the energy and environmental problems become more serious, research for practical use of the EV was regularized from the 1990s.

In the meantime, with the recent rapid development of battery technology, the EV and the Hybrid Electric Vehicle (HEV) adaptively using fossil fuel and electrical energy are being commercialized. Since the HEV utilizes gasoline and electricity together as a power source, the HEV are receiving positive reviews in terms of improving fuel economy and reducing exhaust gas, and are expected to play an intermediate role in evolving into a complete EV.

The HEV and the EV using electrical energy utilizes a battery in which a plurality of chargeable/dischargeable secondary cells is formed in one pack as a main power source, so that the HEV and the EV have no exhaust gas at all and have very low noise.

The vehicle using electrical energy utilizes a high-voltage battery of commonly about 300 V to 700 V to supply high-output energy to an electric motor and the like.

In the vehicle using electrical energy, it is very important to secure safety of high-power electric devices to avoid direct contact from risk factors caused by the use of the high-voltage battery and protect a driver, passengers, and the like.

Accordingly, a Battery Management System (BMS) semiconductor which monitors and manages a high-voltage battery, such as a lithium-ion battery, is applied to a vehicle to secure stability of the vehicle.

The inside of the BMS semiconductor is provided with a diode for Electrostatic Discharge (ESD) protection.

However, the protection diode has a problem of unintentionally generating a leakage current and consuming power of the battery.

An input terminal of an external battery of the BMS semiconductor is connected to a capacitor in parallel.

The capacitor may be damaged by ESD, and there is a problem in that a leakage current is generated during the damage to the capacitor and consumes power of the battery.

To solve the problem, the BMS semiconductor in the related art detects a leakage current by use of a difference in a cell voltage value between a sensing terminal and a balancing terminal. However, both the sensing terminal and the balancing terminal of the BMS semiconductor require an Analog to Digital Converter (ADC) or a Multiplexer (MUX) to detect a leakage current, so that there is a problem in that a circuit configuration is complex.

The information included in this Background of the present invention section is only for enhancement of understanding of the general background of the present invention and may not be taken as an acknowledgement or any form of suggestion that this information forms the prior art already known to a person skilled in the art.

BRIEF SUMMARY

Various aspects of the present invention are directed to providing a Battery Management System (BMS) semiconductor device having a leakage current detection function, which detects a leakage current by adding a simple comparator and not a separate Analog to Digital Converter (ADC), to a balancing terminal of a battery, and a leakage current detection method.

Various aspects of the present invention are directed to providing a Battery Management System (BMS) semiconductor device having a leakage current detection function, including: a comparator configured to compare a voltage of a balancing terminal connected to a positive voltage terminal of a battery cell and a voltage of a lower sensing terminal connected to a negative voltage terminal of the battery cell and output a result of the comparing; an ADC connected to the upper sensing terminal and the lower sensing terminal and configured to sense a voltage difference between the upper sensing terminal connected to the positive voltage terminal of the battery cell and the lower sensing terminal; and a leakage current determining unit connected to the ADC and the comparator and configured to set a variable threshold value according to the voltage difference sensed by the ADC and determine whether a leakage current is generated by use of the result of the comparing in the comparator and the variable threshold value.

The variable threshold value may include an overvoltage threshold value and a low-voltage threshold value.

The leakage current determining unit may set the overvoltage threshold value by adding a predetermined allowable error to the sensing value of the ADC, and set the low-voltage threshold value by subtracting the allowable error from the sensing value of the ADC.

When the result of the comparing in the comparator exceeds the overvoltage threshold value or equal to or less than the low-voltage threshold value, the leakage current determining unit may determine that at least one leakage current case occurs.

The BMS semiconductor device may further include a balancing circuit including: a first filter resistor connected between the positive voltage terminal of the battery cell and the upper sensing terminal; a second filter resistor connected between the negative voltage terminal of the battery cell and the lower sensing terminal; a balancing resistor connected between the positive voltage terminal of the battery cell and the balancing terminal; a filter capacitor connected between the upper sensing terminal and the lower sensing terminal; and a feedback capacitor connected between the balancing terminal and the lower sensing terminal.

The leakage current determining unit may compare the result of the comparing in the comparator with the overvoltage threshold value or the low-voltage threshold value and determine a first leakage current case according to a failure of the filter capacitor, a second leakage current case according to a short-circuit failure of the upper sensing terminal, and a third leakage current case according to a failure of the feedback capacitor.

When the result of the comparing in the comparator exceeds the overvoltage threshold value, the leakage current determining unit may determine that the first leakage current case or the second leakage current case according to a generation of overvoltage occurs.

When the result of the comparing in the comparator is equal to or smaller than the low-voltage threshold value, the leakage current determining unit may determine that the third leakage current case according to a generation of a low-voltage occurs.

Various aspects of the present invention are directed to providing a method of detecting a leakage current of a Battery Management System (BMS) semiconductor device including a balancing terminal connected to a positive voltage terminal of a battery cell, a lower sensing terminal connected to a negative voltage terminal of the battery cell, and an upper sensing terminal connected to the positive voltage terminal of the battery cell, the method including: a sensing operation of detecting a voltage difference between the upper sensing terminal and the lower sensing terminal; a threshold value setting operation of setting a variable threshold value by use of a sensing value in the sensing operation; a comparison operation of comparing a voltage of the balancing terminal and a voltage of the lower sensing terminal and outputting a comparison result; and a leakage current detecting operation of detecting a generation of a leakage current by use of the variable threshold value and the comparison result in the comparison operation.

The threshold value setting operation may include: setting an overvoltage threshold value by adding a predetermined allowable error value to the sensing value in the sensing operation; and setting a low-voltage threshold value by subtracting the allowable error value from the sensing value in the sensing operation.

The method may further include an overvoltage determining operation of determining whether an overvoltage is generated by comparing the comparison result in the comparison operation and the overvoltage threshold value.

The leakage current detecting operation may include a first leakage current detecting operation in which when it is determined that the overvoltage is generated because the comparison result exceeds the overvoltage threshold value, it is determined that a first leakage current case in which a leakage current flows from the upper sensing terminal to the lower sensing terminal or a second leakage current case in which a leakage current flows from the upper sensing terminal to a ground occurs.

The method may further include a low-voltage determining operation of determining whether a low-voltage is generated by comparing the comparison result in the comparison operation and the low-voltage threshold value.

The leakage current detecting operation may include a second leakage current detecting operation in which when it is determined that the low-voltage is generated because the comparison result is equal to or smaller than the low-voltage threshold value, it is determined that a third leakage current case in which the leakage current flows from the balancing terminal to the lower sensing terminal occurs.

The method may further include a leakage current non-detecting operation of determining that a leakage current case does not occur when the comparison result is equal to or smaller than the overvoltage threshold value and exceeds the low-voltage threshold value.

According to the BMS semiconductor device having the leakage current detection function and the leakage current detection method according to the exemplary embodiments of the present invention, it is possible to detect a leakage current even though only a simple comparator circuit is applied without additionally providing a separate semiconductor component, such as an ADC, in a balancing terminal of a battery.

The foregoing BRIEF SUMMARY is illustrative only and is not intended to be in any way limiting. In addition to the illustrative aspects, embodiments, and features described above, further aspects, embodiments, and features will become apparent by reference to the drawings and the following detailed description.

The methods and apparatuses of the present invention have other features and advantages which will be apparent from or are set forth in more detail in the accompanying drawings, which are incorporated herein, and the following Detailed Description, which together serve to explain certain principles of the present invention.

It may be understood that the appended drawings are not necessarily to scale, presenting a somewhat simplified representation of various features illustrative of the basic principles of the present invention. The specific design features of the present invention as included herein, including, for example, specific dimensions, orientations, locations, and shapes will be determined in part by the particularly intended application and use environment.

In the figures, reference numbers refer to the same or equivalent portions of the present invention throughout the several figures of the drawing.

DETAILED DESCRIPTION

Reference will now be made in detail to various embodiments of the present invention(s), examples of which are illustrated in the accompanying drawings and described below. While the present invention(s) will be described in conjunction with exemplary embodiments of the present invention, it will be understood that the present description is not intended to limit the present invention(s) to those exemplary embodiments. On the other hand, the present invention(s) is/are intended to cover not only the exemplary embodiments of the present invention, but also various alternatives, modifications, equivalents and other embodiments, which may be included within the spirit and scope of the present invention as defined by the appended claims.

Figure 1:
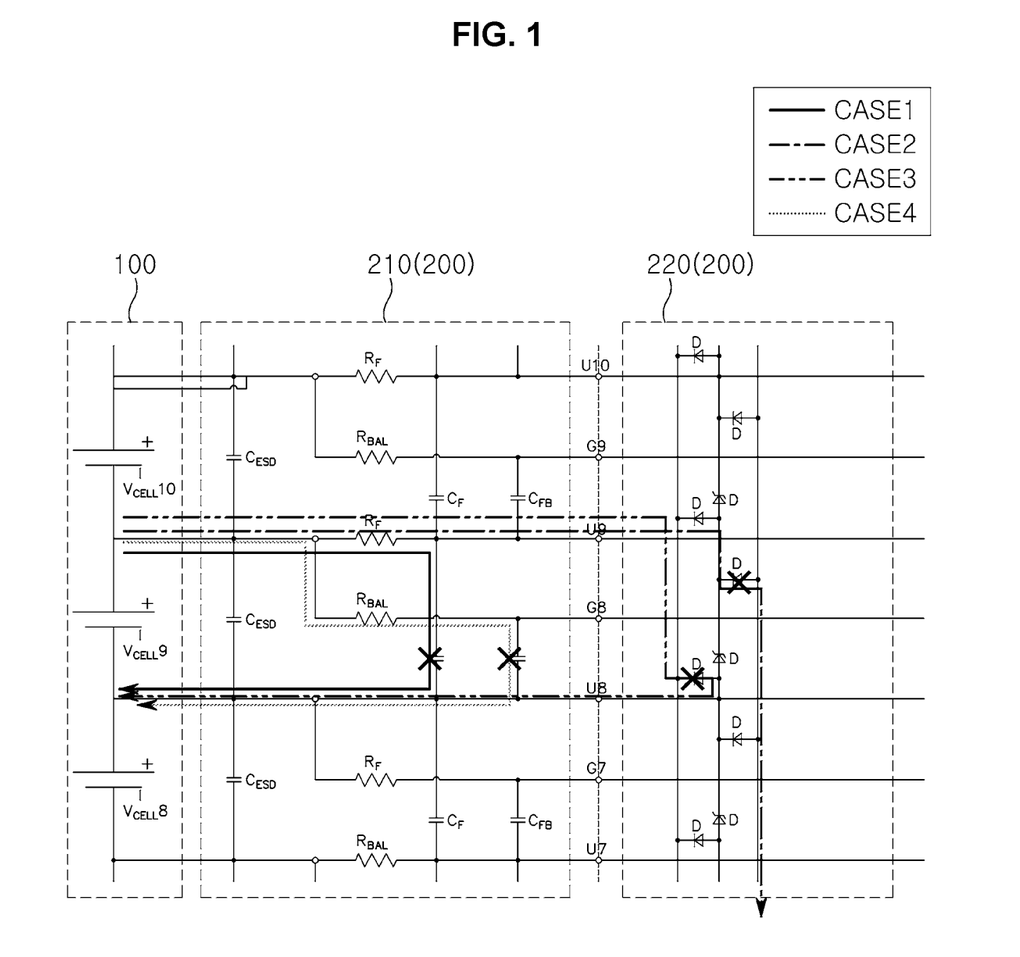
FIG. 1 is a diagram illustrating a failure situation which may occur in a Battery Management System (BMS) semiconductor device.

FIG. 1 is a diagram illustrating a failure situation which may occur in a Battery Management System (BMS) semiconductor device.

Referring to FIG. 1, a general BMS semiconductor device 200 may include a balancing circuit 210 for balancing a battery module 100, and a control circuit 220 inside a semiconductor chip provided with a plurality of diodes D for Electrostatic Discharge (ESD) protection of the balancing circuit 210. The balancing circuit 210 and the control circuit 220 may be connected to a plurality of sensing terminals U7, U8, U9, and U10 through a plurality of balancing terminals G7, G8, and G9. The plurality of sensing terminals U7, U8, U9, and U10 and the plurality of balancing terminals G7, G8, and G9 may be provided for balancing and sensing a voltage of each of the battery cells of the battery module 100.

The balancing circuit 210 may include a plurality of filter resistors RF for filtering a voltage of each of the battery cells VCELL8, VCELL9, and VCELL10, a plurality of balancing resistors RBAL for balancing voltages, a plurality of discharge capacitors CESD for electrostatic discharge, a plurality of capacitors CF for filtering a voltage, and a plurality of feedback capacitors CFB for voltage feedback.

The BMS semiconductor device 200 has about four types of failure cases.

In the first failure case CASE1, a filter capacitor CF of the balancing circuit 210 has a failure. In the instant case, a first leakage current case occurs in the circuit in which the capacitor CF is located. The first leakage current case will be described below with reference to FIG. 3.

In the second failure case CASE2 and the third failure case CASE3, a diode D of the control circuit 220 has a failure. A difference between the case CASE2 and the case CASE3 is a difference in a location of the diode D in which a failure is generated. In the instant case, a second leakage current case in which a leakage current flows to a ground occurs. The second leakage current case will be described below with reference to FIG. 4.

In the fourth failure case CASE4, a feedback capacitor CFB of the balancing circuit 210 has a failure. In the instant case, a third leakage current case occurs in a circuit in which the feedback capacitor CFB is located. The third leakage current case will be described below with reference to FIG. 5.

In the case where the leakage current case for each failure case occurs, power of the battery module 100 is consumed, and the BMS semiconductor device 200 has a leakage current detection function to prevent the consumption of power. The BMS semiconductor device 200 detects the leakage current case and notifies the detection of the leakage current case, facilitating quick failure repair.

Figure 2:
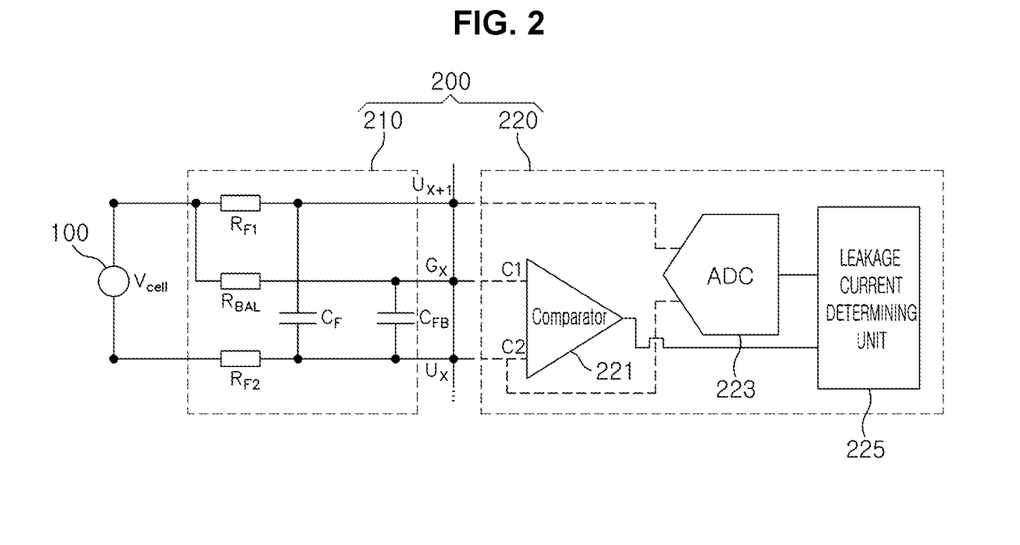
FIG. 2 is a schematic circuit diagram of a BMS semiconductor device having a leakage current detection function according to various exemplary embodiments of the present invention.

FIG. 2 is a schematic circuit diagram of the BMS semiconductor device having the leakage current detection function according to the exemplary embodiment of the present invention.

Referring to FIG. 2, the BMS semiconductor device 200 having the leakage current detection function according to the exemplary embodiment of the present invention may include the balancing circuit 210 and the control circuit 220, and the control circuit 220 of the BMS semiconductor device 200 may include a comparator 221, an ADC 223, and a leakage current determining unit 225 to detect a leakage current of a battery cell $V_{cell}$. Herein, one battery cell $V_{cell}$ is illustrated, but the present invention is not limited thereto. That is, a plurality of battery cells Vcell may be provided. The plurality of battery cells $V_{cell}$ may be serially connected to each other to form the battery module 100. The balancing circuit 210 and the control circuit 220 may be additionally provided for balancing each battery cell $V_{cell}$.

The balancing circuit 210 may include a first filter resistor $R_{F1}$ of which one end portion is connected to a positive voltage terminal of the battery cell $V_{cell}$, and a balancing resistor $R_{BAL}$. The other end portion of the first filter resistor $R_{F1}$ may be connected to a corresponding sensing terminal $U_{X+1}$. The other end portion of the balancing resistor $R_{BAL}$ may be connected to a corresponding balancing terminal $G_X$.

The balancing circuit 210 may include a second filter resistor $R_{F2}$ of which one end portion is connected to a negative voltage terminal of the battery cell $V_{cell}$. The other end portion of the second filter resistor $R_{F2}$ may be connected to a corresponding sensing terminal $U_X$.

The balancing circuit 210 may include the filter capacitor $C_F$ of which both end portions are connected to the sensing terminals $U_{X+1}$ and $U_X$, and the feedback capacitor $C_{FB}$ of which both end portions are connected to the balancing terminals $G_X$ and the sensing terminal $U_X$. Hereinafter, the sensing terminal $U_{X+1}$ connected to the positive voltage terminal of the battery cell $V_{cell}$ is defined as an upper sensing terminal, and the sensing terminal $U_X$ connected to the negative voltage terminal of the battery cell $V_{cell}$ is defined as a lower sensing terminal.

A first input terminal C1 of the comparator 221 may be connected to the balancing terminal $G_X$, and a second input terminal C2 thereof may be connected to the lower sensing terminal $U_X$ which is connected to the negative voltage terminal of the battery cell $V_{cell}$. The comparator 221 may compare a voltage input to the first input terminal C1 and a voltage input to the second input terminal C2 and output a comparison result. The comparison result of the comparator 221 may be used for determining the generation of a leakage current.

The ADC 223 may sense a voltage difference between the upper sensing terminal $U_{X+1}$ connected to the positive voltage terminal of the battery cell $V_{cell}$ and the lower sensing terminal $U_X$ connected to the negative voltage terminal of the battery cell $V_{cell}$. The ADC 223 may convert an analog voltage of the battery cell $V_{cell}$ input to the sensing terminals $U_X$ and $U_{X+1}$ into a digital value and output the digital value. The sensing value of the ADC 223 may be used for determining the generation of a leakage current.

The leakage current determining unit 225 may receive the comparison result of the comparator 221 and the sensing value of the ADC 223. The leakage current determining unit 225 may determine the generation of a leakage current by use of the comparison result of the comparator 221 and the sensing value of the ADC 223.

Hereinafter, the method of determining the generation of a leakage current will be described.

Figure 3:
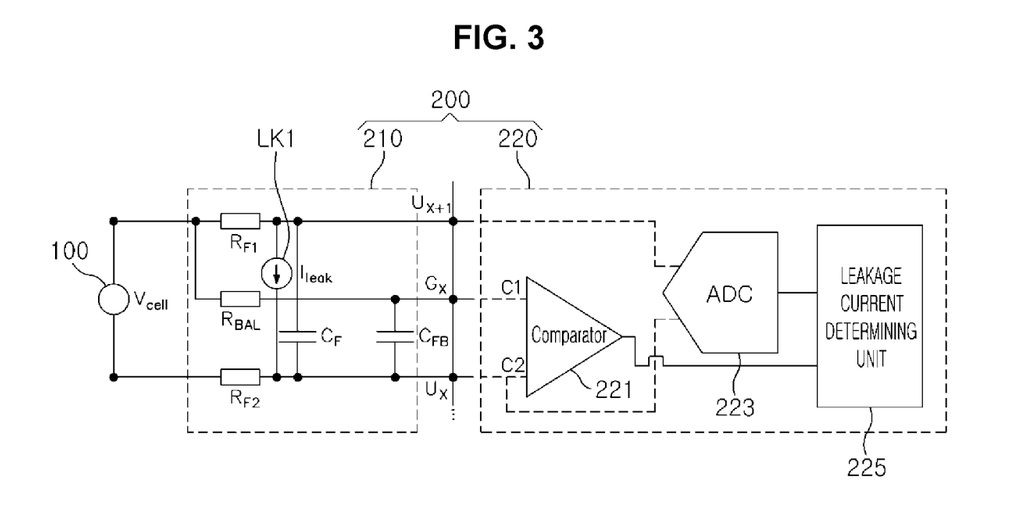
FIG. 3 is a diagram illustrating a first leakage current case of the BMS semiconductor device having the leakage current detection function according to the exemplary embodiment of the present invention.

FIG. 3 is a diagram illustrating the first leakage current case of the BMS semiconductor device having the leakage current detection function according to the exemplary embodiment of the present invention.

Referring to FIG. 3, the first leakage current case LK1 according to a failure of the filter capacitor $C_F$ may be checked. The first leakage current case LK1 may occur according to the failure case 1 CASE1 which is described with reference to FIG. 1. Due to the occurrence of the failure in the filter capacitor $C_F$, a leakage current $I_{leak}$ is generated in the circuit in which the filter capacitor $C_F$ is located. In the instant case, a voltage of the battery cell $V_{cell}$ may be input to the first input terminal C1 of the comparator 221, and a failure voltage according to a resistance value of the filter resistor $R_F$ and a current value of the leakage current $I_{leak}$ may be input to the second input terminal C2. Furthermore, a voltage of the battery cell $V_{cell}$ dropped according to the failure voltage may be input to the ADC 223.

In the exemplary embodiment of the present invention, in the case where the voltage of the battery cell $V_{cell}$ is 4V, and the filter resistor RF is 1Ω, the failure voltage according to the leakage current $I_{leak}$ of 10 mA may be 0.1 V. Accordingly, 3.9 V of the voltage of the battery cell $V_{cell}$ which is dropped by 0.1 V of the failure voltage may be applied to the upper sensing terminal $U_{X+1}$, and 0.1 V of the failure voltage may be applied to the lower sensing terminal $U_X$. The input voltage input to the ADC 223 may be represented with 3.8 V obtained by subtracting the voltage of the lower sensing terminal $U_X$ from the voltage of the upper sensing terminal $U_{X+1}$. Furthermore, 4 V of the voltage of the battery cell $V_{cell}$ may be input to the first input terminal C1 of the comparator 221, and 0.1 V of the failure voltage may be input to the second input terminal C2. The comparison result of the comparator 221 may be represented with 3.9 V obtained by subtracting the voltage of the second input terminal C2 from the voltage of the first input terminal C1. As described above, the comparison result of the comparator 221 and the input voltage of the ADC 223 have a voltage difference of 0.1 V. The leakage current determining unit 225 may determine that the first leakage current case LK1 occurs according to the failure of the filter capacitor $C_F$ based on the voltage difference.

Figure 4:
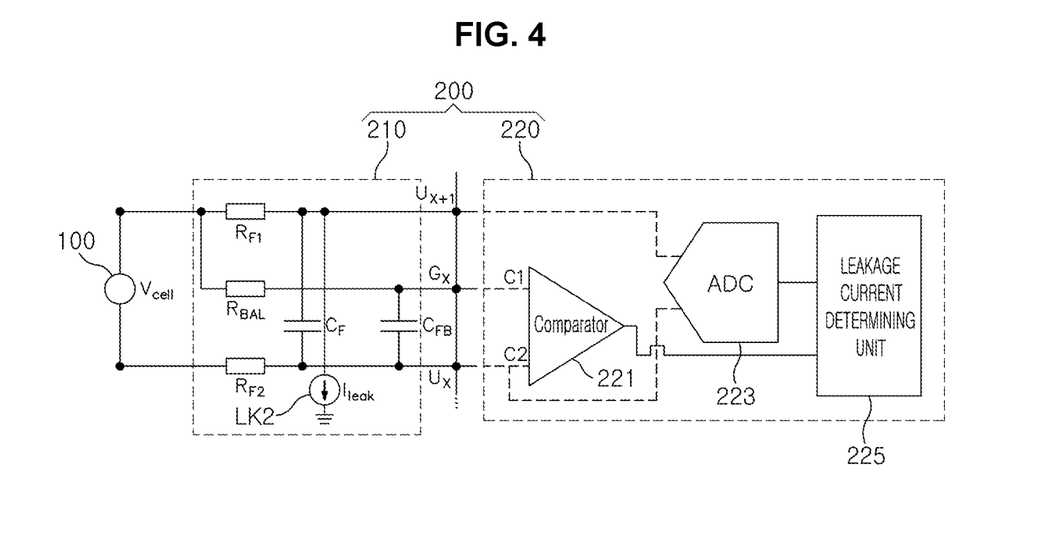
FIG. 4 is a diagram illustrating a second leakage current case of the BMS semiconductor device having the leakage current detection function according to the exemplary embodiment of the present invention.

FIG. 4 is a diagram illustrating the second leakage current case of the BMS semiconductor device having the leakage current detection function according to the exemplary embodiment of the present invention.

Referring to FIG. 4, the second leakage current case LK2 according to a short-circuit failure of the upper sensing terminal $U_{X+1}$ occurring by a diode failure of the control circuit 220 may be checked. The second leakage current case LK2 may occur according to the failure case 2 CASE2 or the failure case 3 CASE3 which is described with reference to FIG. 1. According to the generation of the diode failure of the control circuit 220, the upper sensing terminal $U_{X+1}$ may be connected to the ground. In the instant case, the leakage current $I_{leak}$ flowing to the ground is generated. In the instant case, the voltage of the battery cell $V_{cell}$ dropped according to the failure may be input to the ADC 223.

In the exemplary embodiment of the present invention, in the case where the voltage of the battery cell $V_{cell}$ is 4 V, and the filter resistor RF is 1Ω, the failure voltage according to the leakage current $I_{leak}$ of 100 mA may be 0.1 V. Accordingly, 3.9 V of the voltage of the battery cell $V_{cell}$ dropped by 0.1 V of the failure voltage may be applied to the upper sensing terminal $U_{X+1}$. The input voltage input to the ADC 223 may be represented with 3.9 V of the voltage of the upper sensing unit $U_{X+1}$. Furthermore, 4.V of the voltage of the battery cell $V_{cell}$ may be input to the first input terminal C1 of the comparator 221. Accordingly, the comparison result of the comparator 221 may be represented with 4 V of the voltage of the battery cell $V_{cell}$. As described above, the comparison result of the comparator 221 and the input voltage of the ADC 223 have a voltage difference of 0.1 V. The leakage current determining unit 225 may determine that the second leakage current case LK2 occurs according to the failure of the filtering diode based on the voltage difference.

Figure 5:
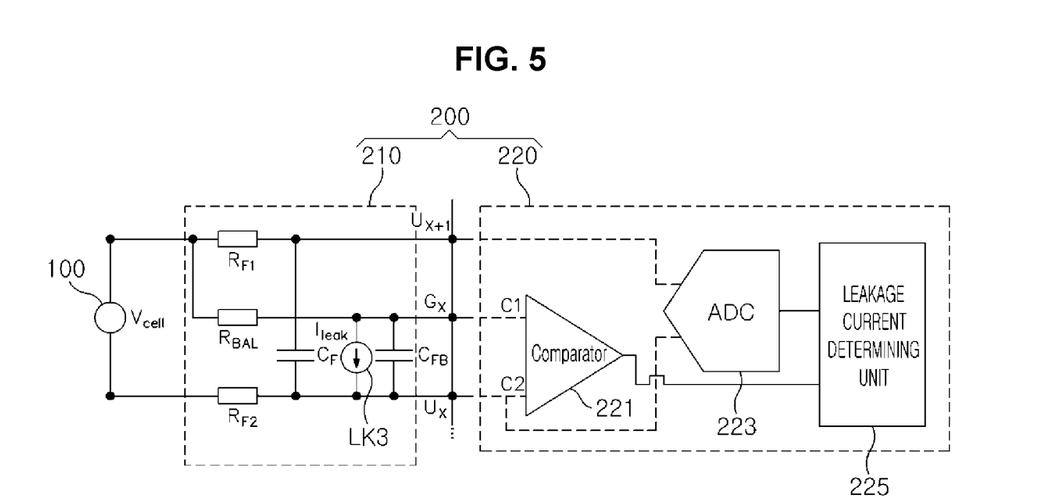
FIG. 5 is a diagram illustrating a third leakage current case of the BMS semiconductor device having the leakage current detection function according to the exemplary embodiment of the present invention.

FIG. 5 is a diagram illustrating the third leakage current case of the BMS semiconductor device having the leakage current detection function according to the exemplary embodiment of the present invention.

Referring to FIG. 5, the third leakage current case LK3 according to a failure of the feedback capacitor $C_{FB}$ may be checked. The third leakage current case LK3 may occur according to the failure case 4 CASE4 which is described with reference to FIG. 1. Due to the occurrence of the failure in the feedback capacitor $C_{FB}$, a leakage current $I_{leak}$ is generated in the circuit in which the feedback capacitor $C_{FB}$ is located.

In the exemplary embodiment of the present invention, in the case where the voltage of the battery cell $V_{cell}$ is 4 V, and the filter resistor RF is 1Ω, the failure voltage according to the leakage current $I_{leak}$ of 10 mA may be 0.1 V. Accordingly, 4 V of the normal voltage of the battery cell $V_{cell}$ may be applied to the upper sensing terminal $U_{X+1}$, and 0.1 V of the failure voltage may be applied to the lower sensing terminal $U_X$. 3.9 V of the voltage which is dropped by 0.1 V of the failure voltage applied to the balancing resistor $R_{BAL}$ from 4 V of the voltage of the battery cell $V_{cell}$ may be applied to the balancing terminal $G_X$. The input voltage input to the ADC 223 may be represented with 3.9 V obtained by subtracting the voltage of the lower sensing terminal $U_X$ from the voltage of the upper sensing terminal $U_{X+1}$. Furthermore, 3.9 V of the voltage of the battery cell $V_{cell}$ which is dropped by 0.1 V of the failure voltage may be input to the first input terminal C1 of the comparator 221, and 0.1 V of the failure voltage may be input to the second input terminal C2. The comparison result of the comparator 221 may be represented with 3.8 V which is a value obtained by subtracting the voltage of the second input terminal C2 from the voltage of the first input terminal C1. As described above, the comparison result of the comparator 221 and the input voltage of the ADC 223 have a voltage difference of 0.1 V. The leakage current determining unit 225 may determine that the third leakage current case LK3 occurs according to the failure of the feedback capacitor $C_{FB}$ based on the voltage difference.

Figure 6:
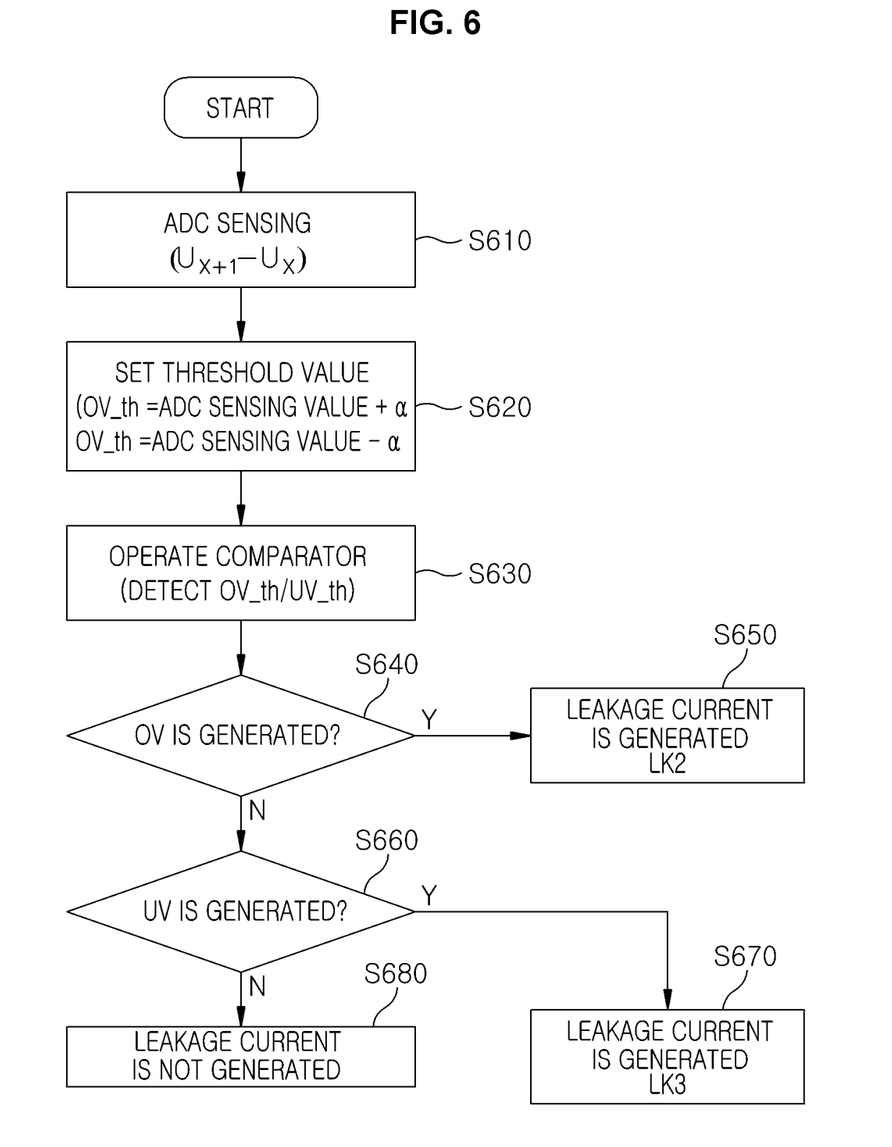
FIG. 6 is a flowchart illustrating a leakage current detection method according to various exemplary embodiments of the present invention.

FIG. 6 is a flowchart illustrating a leakage current detection method of the BMS semiconductor device according to various exemplary embodiments of the present invention.

Referring to FIGS. 2 to 6, a leakage current detection method of the BMS semiconductor device according to various exemplary embodiments of the present invention may include a sensing operation S610, a threshold value setting operation S620, a comparison operation S630, an overvoltage determining operation S640, a first leakage current detecting operation S650, a low-voltage determining operation S660, a second leakage current detecting operation S670, and a leakage current not-detecting operation S680.

In the sensing operation S610, the ADC 223 senses a voltage difference between the upper sensing terminal $U_{X+1}$ and the lower sensing terminal $U_X$.

In the threshold value setting operation S620, the leakage current determining unit 225 sets a variable threshold value by use of the voltage difference sensed by the ADC 223. The variable threshold value includes an overvoltage threshold value OV_th and a low-voltage threshold value UV_th. Herein, the overvoltage threshold value OV_th may be set with a value obtained by adding an allowable error value $\alpha$ to the sensing value of the ADC 223. Furthermore, the low-voltage threshold value UV_th may be set with a value obtained by subtracting the allowable error value $\alpha$ from the sensing value of the ADC 223. The overvoltage threshold value OV_th and the low-voltage threshold value UV_th may be variable according to the change in the sensing value of the ADC 223.

In the comparison operation S630, the comparator 221 compares a voltage of the balancing terminal $G_X$ applied to the first input terminal C1 and a voltage of the lower sensing terminal $U_X$ applied to the second input terminal C2. The comparator 221 transmits the comparison result to the leakage current determining unit 225.

In the overvoltage determining operation S640, the leakage current determining unit 225 compares the comparison result of the comparator 221 with the overvoltage threshold value and determines whether an overvoltage is generated. When the comparison result of the comparator 221 exceeds the overvoltage threshold value, the leakage current determining unit 225 determines that the overvoltage is generated.

In the first leakage current detecting operation S650, when it is determined that the overvoltage is generated because the comparison result of the comparator 221 exceeds the overvoltage threshold value, the leakage current determining unit 225 may determine that the first leakage current case LK1 or the second leakage current case LK2 occurs. The leakage current determining unit 225 may also divide and determine the first leakage current case LK1 or the second leakage current case LK2 through an additional setting.

In the low-voltage determining operation S660, the leakage current determining unit 225 compares the comparison result of the comparator 221 with the low-voltage threshold value and determines whether a low-voltage is generated. When the comparison result of the comparator 221 is equal to or smaller than the low-voltage threshold value, the leakage current determining unit 225 determines that the low-voltage is generated.

In the second leakage current detecting operation S670, when it is determined that the low-voltage is generated because the comparison result of the comparator 221 is equal to or smaller than the low-voltage threshold value, the leakage current determining unit 225 may determine that the third leakage current case LK3 occurs.

In the leakage current non-detecting operation S680, when it is determined that the comparison result of the comparator 221 exceeds the low-voltage threshold value and is less than the overvoltage threshold value, the leakage current determining unit 225 may determine that the leakage current case does not occur.

Although various exemplary embodiments of the present invention has been described for illustrative purposes, those skilled in the art will appreciate that various modifications, additions and substitutions are possible, without departing from the scope and spirit of the present invention as included in the accompanying claims. Therefore, the exemplary embodiments included in various exemplary embodiments of the present invention and the accompanying drawings are not intended to limit the technical spirit of the present invention, but are intended to illustrate the scope of the technical idea of the present invention, and the scope of the present invention is not limited by the exemplary embodiment and the accompanying drawings.

The steps and/or operations according to various exemplary embodiments of the present invention may occur in different orders, or in parallel, or simultaneously in different exemplary embodiments for different epochs and the like as may be appreciated by those skilled in the art.

Depending on the exemplary embodiment of the present invention, a part or the entirety of the steps and/or operations may be implemented or performed by use of commands stored in one or more non-temporary computer-readable media, a program, an interactive data structure, and one or more processors driving a client and/or a server. One or more non-temporary computer-readable media are, for example, software, firmware, hardware, and/or any combination thereof. Furthermore, the function of "module" discussed in the present specification may be implemented by software, firmware, hardware, and/or any combination thereof.

Meanwhile, the exemplary embodiments according to various exemplary embodiments of the present invention may be implemented in a form of program instructions which may be executed by computers, and may be recorded in computer readable media. The computer readable media may include program instructions, a data file, a data structure, or a combination thereof. By way of example, and not limitation, computer readable media may include computer storage media and communication media. Computer storage media includes both volatile and nonvolatile, removable and non-removable media implemented in any method or technology for storage of information such as computer readable instructions, data structures, program modules or other data. Computer storage media includes, but is not limited to, RAM, ROM, EEPROM, flash memory or other memory technology, CD-ROM, digital versatile disks (DVD) or other optical disk storage, magnetic cassettes, magnetic tape, magnetic disk storage or other magnetic storage devices, or any other medium which may be used to store the desired information and which can accessed by computer. Communication media typically embodies computer readable instructions, data structures, program modules or other data in a modulated data signal such as a planet carrier wave or other transport mechanism and includes any information delivery media. The term "modulated data signal" means a signal that has one or more of its characteristics set or changed to encode information in the signal. By way of example, and not limitation, communication media includes wired media such as a wired network or direct-wired connection, and wireless media such as acoustic, RF, infrared and other wireless media. Combinations of any of the above may also be included within the scope of computer readable media.

As described above, the exemplary embodiments have been described and illustrated in the drawings and the specification. The exemplary embodiments were chosen and described to explain certain principles of the present invention and their practical application, to thereby enable others skilled in the art to make and utilize various exemplary embodiments of the present invention, as well as various alternatives and modifications thereof. As is evident from the foregoing description, certain aspects of the present invention are not limited by the particular details of the examples illustrated herein, and it is therefore contemplated that other modifications and applications, or equivalents thereof, will occur to those skilled in the art. Many changes, modifications, variations and other utilizes and applications of the present construction will, however, become apparent to those skilled in the art after considering the specification and the accompanying drawings. All such changes, modifications, variations and other utilizes and applications which do not depart from the spirit and scope of the present invention are deemed to be covered by the present invention which is limited only by the claims which follow.

The foregoing descriptions of specific exemplary embodiments of the present invention have been presented for purposes of illustration and description. They are not intended to be exhaustive or to limit the present invention to the precise forms disclosed, and obviously many modifications and variations are possible in light of the above teachings. The exemplary embodiments were chosen and described to explain certain principles of the present invention and their practical application, to enable others skilled in the art to make and utilize various exemplary embodiments of the present invention, as well as various alternatives and modifications thereof. It is intended that the scope of the present invention be defined by the Claims appended hereto and their equivalents.

What is claimed is:

1. A Battery Management System (BMS) semiconductor device having a leakage current detection function, the BMS semiconductor device comprising:
   a comparator configured to compare a voltage of a balancing terminal connected to a positive voltage terminal of a battery cell and a voltage of a lower sensing terminal connected to a negative voltage terminal of the battery cell and to output a result of the comparing;
   an Analog to Digital Converter (ADC) connected to an upper sensing terminal and the lower sensing terminal and configured to sense a voltage difference between the upper sensing terminal connected to the positive voltage terminal of the battery cell and the lower sensing terminal; and
   a leakage current determining unit connected to the ADC and the comparator and configured to determine a variable threshold value based on the voltage difference sensed by the ADC and to determine whether a leakage current is generated based on a result of the comparing in the comparator and the variable threshold value.

2. The BMS semiconductor device of claim 1, wherein the variable threshold value includes an overvoltage threshold value and a low-voltage threshold value.

3. The BMS semiconductor device of claim 2, wherein the leakage current determining unit is configured to set the overvoltage threshold value by adding a predetermined allowable error to a sensing value of the ADC, and to set the low-voltage threshold value by subtracting the allowable error from the sensing value of the ADC.

4. The BMS semiconductor device of claim 3, wherein upon determining that the result of the comparing in the comparator exceeds the overvoltage threshold value or equal to or less than the low-voltage threshold value, the leakage current determining unit is configured to determine that at least one leakage current case occurs.

5. The BMS semiconductor device of claim 2, further including a balancing circuit having:
   a first filter resistor connected between the positive voltage terminal of the battery cell and the upper sensing terminal;
   a second filter resistor connected between the negative voltage terminal of the battery cell and the lower sensing terminal;
   a balancing resistor connected between the positive voltage terminal of the battery cell and the balancing terminal;
   a filter capacitor connected between the upper sensing terminal and the lower sensing terminal; and
   a feedback capacitor connected between the balancing terminal and the lower sensing terminal.

6. The BMS semiconductor device of claim 5, wherein the leakage current determining unit is configured to compare the result of the comparing in the comparator with the overvoltage threshold value or the low-voltage threshold value and is configured to determine a first leakage current case according to a failure of the filter capacitor, a second leakage current case according to a short-circuit failure of the upper sensing terminal, and a third leakage current case according to a failure of the feedback capacitor.

7. The BMS semiconductor device of claim 6, wherein upon determining that the result of the comparing in the comparator exceeds the overvoltage threshold value, the leakage current determining unit is configured to determine that the first leakage current case or the second leakage current case according to a generation of overvoltage occurs.

8. The BMS semiconductor device of claim 6, wherein upon determining that the result of the comparing in the comparator is equal to or smaller than the low-voltage threshold value, the leakage current determining unit is configured to determine that the third leakage current case according to a generation of a low-voltage occurs.

* * * * *